United States Patent
Nam et al.

(10) Patent No.: US 7,341,888 B2
(45) Date of Patent: Mar. 11, 2008

(54) BALANCE FILTER PACKAGING CHIP HAVING BALUN MOUNTED THEREIN AND MANUFACTURING METHOD THEREOF

(75) Inventors: Kuang-woo Nam, Seoul (KR); Yun-kwon Park, Dongducheon-si (KR); In-sang Song, Seoul (KR); Jea-shik Shin, Suwon-si (KR); Seok-mo Chang, Incheon (KR); Seok-chul Yun, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/435,986

(22) Filed: May 18, 2006

(65) Prior Publication Data
US 2007/0023882 A1    Feb. 1, 2007

(30) Foreign Application Priority Data
Jul. 29, 2005    (KR) ............... 10-2005-0069379

(51) Int. Cl.
*H01L 23/02*    (2006.01)

(52) U.S. Cl. .................. 438/106; 257/678; 257/723; 257/724

(58) Field of Classification Search .......... 363/47, 363/48; 333/25, 185, 202; 455/339; 257/678, 257/E23.044, 723, 724
See application file for complete search history.

(56) References Cited

U.S. PATENT DOCUMENTS

2003/0168716 A1*    9/2003    Lee et al. .............. 257/531
2005/0184831 A1*    8/2005    Yasuda et al. .......... 333/204

* cited by examiner

*Primary Examiner*—Lynne Gurley
*Assistant Examiner*—Meiya Li
(74) *Attorney, Agent, or Firm*—Sughrue Mion, PLLC

(57) ABSTRACT

A balance filter packaging chip having a balun mounted therein and a manufacturing method thereof are provided. The balance filter packaging chip includes a device substrate; a balance filter mounted on the device substrate; a bonding layer stacked on a certain area of the device substrate; a packaging substrate having a cavity formed over the balance filter, and combined with the device substrate by the bonding layer; a balun located on a certain area over the packaging substrate; and an insulator layer for passivating the balun. Accordingly, the present invention can reduce an element size and simplify a manufacturing process.

9 Claims, 6 Drawing Sheets

BALANCE FILTER PACKAGING CHIP HAVING BALUN MOUNTED THEREIN AND MANUFACTURING METHOD THEREOF

CROSS-REFERENCE TO RELATED APPLICATIONS

This application claims benefit under 35 U.S.C. § 119 from Korean Patent Application 10-2005-0069379, filed on Jul. 29, 2005, the entire contents of which are incorporated herein by reference.

BACKGROUND OF THE INVENTION

1. Field of the Invention

Apparatuses and methods consistent with the present invention relate to a balance filter packaging chip having a balun mounted therein and a manufacturing method thereof, and more particularly, to a balance filter packaging chip having a balun mounted therein and a manufacturing method thereof, wherein the balun is fabricated on a packaging substrate so that a chip size can be reduced, and a manufacturing process thereof can be simplified.

2. Description of the Related Art

A balun (balance to unbalance transformer) is a matching transformer used for preventing the break of ground balance of a balanced circuit when a circuit balanced to the ground is coupled with an amplifier circuit of which one end is grounded, or for connecting a circuit balanced to the ground to an unbalanced circuit such as a coaxial cable in a VHF (Very High Frequency) band transmission circuit.

A filter is one type of electronic circuits that passes only the signals of a desired waveform, filtering those of an undesired waveform. Generally, the filter is constructed with a combination of inductance L and capacitance C. A filter employing an element such as a Lecher wire or a coaxial cable is used in a VHF band of very high frequencies, and a waveguide filter is used in microwave bands of frequencies higher than frequencies of the VHF band.

In addition, filters of special purpose include a CR filter having capacitance and resistance, a crystal filter using mechanical resonance, a mechanical filter, and the like. The filters by function are categorized into an LPF (Low Pass Filter) passing only signals below a certain frequency, a HPF (High Pass Filter) passing only signals above a certain frequency, a BPF (Band Pass Filter) passing signals of a certain frequency band, and a BEF (Band Elimination Filter) suppressing only signals of a certain frequency band.

FIG. 1 is a block diagram for showing a configuration of conventional balun and balance filter.

As shown in FIG. 1, an antenna 10 receives signals transmitted in a wireless manner and transmits the received signals to a balun 20. The balun 20 converts the wireless signal received from the antenna 10 into two signals having a phase difference of 180 degrees each other, and outputs the two signals to a balance filter 30.

Since the two signals having a phase difference of 180 degrees each other are inputted to the balance filter 30, the balance filter is superior to an unbalance filter in terms of power efficiency. Therefore, the balance filter 30 consumes less battery power than the unbalance filter, and does not require large signal amplitude so that relatively less noise occurs. Owing to such advantages, the use of the balun and the balance filter are required.

The conventional technology manufactures the balun and the balance filter separately and then connects them together in a hybrid method, or manufactures the balun and the balance filter together through an integration process. The conventional methods cause problems in that an element size becomes large or the product yield goes lower due to a complicated process since the filter is processed together.

SUMMARY OF THE INVENTION

The present invention has been developed in order to address the above and other aspects associated with the conventional arrangement. An aspect of the present invention is to provide a balance filter packaging chip having a balun mounted therein and a manufacturing method thereof, wherein the balun is fabricated on a packaging substrate so that a chip size can be reduced as well as a manufacturing process thereof can be simplified.

The foregoing and other aspects are substantially realized by providing a balance filter packaging chip, comprising a device substrate; at least one balance filter mounted on the device substrate; at least one bonding layer stacked on at least one certain area of the device substrate; a packaging substrate comprising a cavity formed over the at least one balance filter, and combined with the device substrate by the at least one bonding layer; at least one balun located on at least one certain area over the packaging substrate; and an insulator layer which passivates the at least one balun.

The packaging substrate comprises at least one via hole passing through the packaging substrate; at least one metal layer connecting the at least one via hole to the at least one bonding layer; and at least one electrode electrically connected to the at least one via hole on an upper surface of the packaging substrate.

Preferably, but not necessarily, the at least one balun comprises a capacitor and an inductor.

The balance filter packaging chip further comprises at least one connection electrode passing through the insulator layer and connected to the at least one electrode.

The foregoing and other aspects are substantially realized by providing a method of manufacturing a balance filter packaging chip comprising forming a packaging substrate; forming at least one balun over an upper surface of the packaging substrate; and bonding the packaging substrate with a device substrate with at least one balance filter mounted thereon.

The forming of the packaging substrate comprises forming a cavity by etching at least one certain area of a lower surface of the packaging substrate; evaporating a metal layer on the whole lower surface of the packaging substrate; forming at least one via hole by patterning the packaging substrate; filling the at least one via hole with a conductive material by using the metal layer as a seed layer after patterning the metal layer in a certain form; and evaporating at least one electrode connected to each upper portion of the at least one via hole.

The forming the at least one balun comprises operations of (a) evaporating at least one capacitor on at least one certain position of the upper surface of the packaging substrate; (b) passivating at least one capacitor with an insulator while at least one certain portion of the at least one electrode and at least one certain portion of the at least one capacitor remain patterned; (c) plating at least one certain unpassivated portion of the at least one electrode and the at least one capacitor with metal; (d) connecting at least one inductor in a patterning manner to the at least one certain portion of the at least one capacitor plated with metal; and (e) passivating the at least one inductor with the insulator while the at least one certain portion of the at least one electrode remains patterned.

Preferably, but not necessarily, in operation (b), the passivation is performed with polymer.

The method further comprises an operation of plating the at least one certain portion of the at least one electrode with gold (Au) after operation (e) is performed.

Preferably, but not necessarily, the bonding of the packaging substrate with the device substrate comprises stacking at least one bonding layer between at least one certain portion of at least one metal layer evaporated on a lower surface of the packaging substrate and at least one certain portion of an upper surface of the device substrate, and bonding the packaging substrate with the device substrate.

The method further comprises attaching a certain amount of lead (Pb) over the plated gold (Au).

The method further comprises dicing the bonded packaging substrate and device substrate.

Preferably, but not necessarily, the polymer comprises benzocyclobutene (BCB).

BRIEF DESCRIPTION OF THE DRAWINGS

The above aspects and features of the present invention will be more apparent by describing certain exemplary embodiments of the present invention with reference to the accompanying drawings, in which.

DESCRIPTION OF THE EXEMPLARY EMBODIMENTS

Hereinafter, the present invention will be described in great detail with reference to the accompanying drawings.

Figure 1:
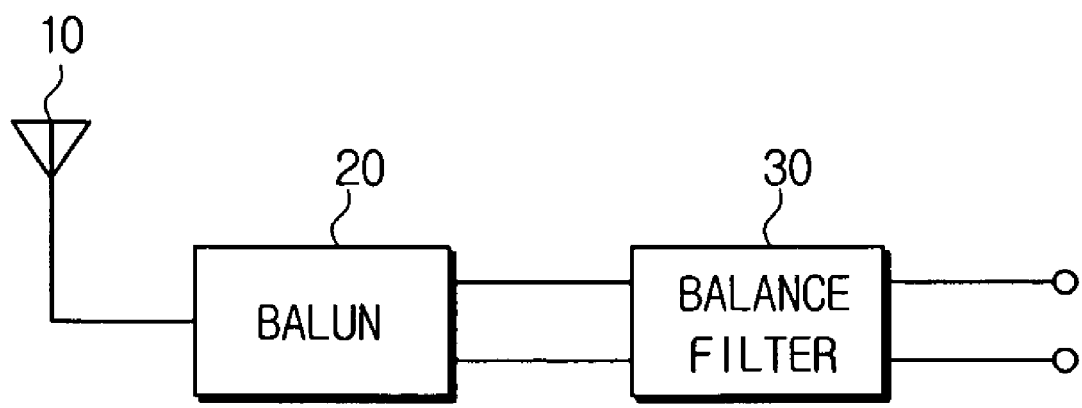
FIG. 1 is a block diagram for showing a configuration of conventional balun and balance filter.
Figure 2:
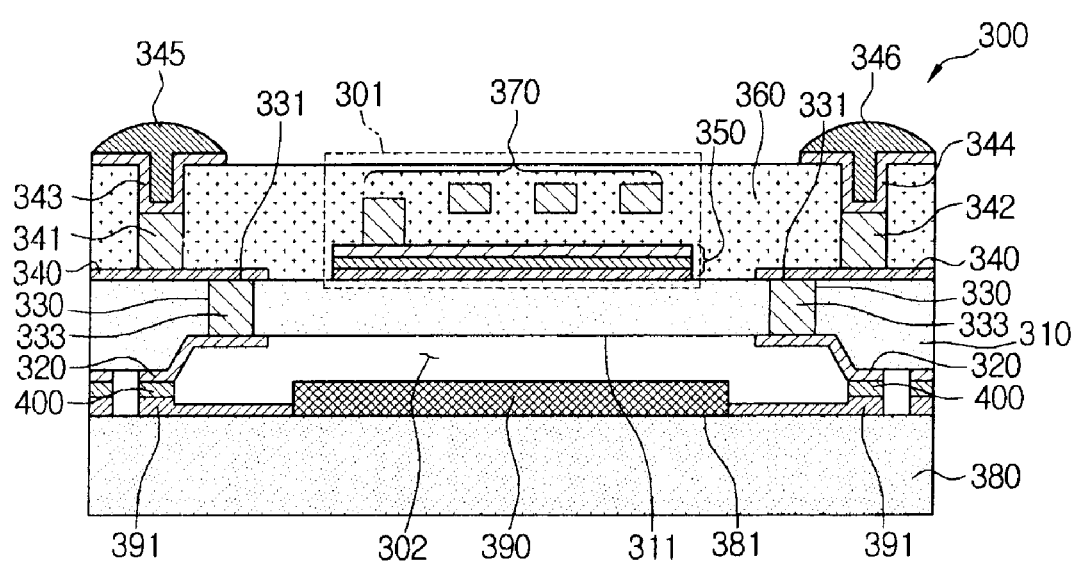
FIG. 2 is a vertical cross-sectional view for showing a configuration of a balance filter packaging chip having a balun mounted therein according to an exemplary embodiment of the present invention.

FIG. 2 is a vertical cross-sectional view for showing a configuration of a balance filter packaging chip 300 having a balun 301 mounted therein according to an exemplary embodiment of the present invention.

As shown in FIG. 2, the balance filter packaging chip 300 having a balun mounted therein according to the present invention comprises a packaging substrate 310, a metal layer 320, via holes 330, electrodes 340, an insulator layer 360, the balun 301 comprising a capacitor 350 and an inductor 370, a device substrate 380, a balance filter 390, a bonding layer 400, a layer 391 electrically connecting the bonding layer 400 to the balance filter 390.

The device substrate 380 is formed of a semiconductor wafer, on which the balance filter 390 is mounted or evaporated. The balance filter 390 is fabricated on the upper surface of the device substrate 380, or can be embedded in the device substrate 380 if the device substrate 380 is a printed circuit board (PCB).

The bonding layer 400 is stacked on a certain area of the device substrate 380, and combines the packaging substrate 310 with the device substrate 380. An alloy of gold and tin, or the like, is used for the bonding layer 400.

A cavity 302 is formed in an empty space between a lower surface 311 of the packaging substrate 310 and the device substrate 380. Accordingly, the packaging substrate 310 and the device substrate 380 are combined with each other, while a sufficient space is secured for the balance filter 390 to be placed within the cavity 302.

The packaging substrate 310 is a wafer for protecting the balance filter 390. A silicon wafer, which is a general semiconductor wafer, can be used as the packaging substrate 310.

In order to combine the packaging substrate 310 with the device substrate 380, the bonding layer 400 formed of solder is stacked on a certain location of the upper surface of the device substrate 380. The bonding layer 400 hermetically seals the balance filter 390.

The packaging substrate 310 includes at least one or more via holes 330 passing through the packaging substrate, the metal layer 320 connecting at least one or more via holes 330 to the bonding layer 400, and at least one or more electrodes 340 electrically connected to an upper portion 331 of at least one or more via holes 330 on the upper surface of the packaging substrate 310.

One or more via holes 330 passing through the packaging substrate 310 are constructed to be generally filled with a conductive material 333 such as copper, so that a balun terminal can be connected to the balance filter 390.

The metal layer 320 is formed of metal, evaporated on the bottoms of the via holes 330, and connected to the balance filter 390. Further, the metal layer 320 serves as a seed layer for plating the via holes 330.

The electrodes 340 are electrically connected to the upper portion 331 of the via holes 330 on the upper surface of the packaging substrate 310, and sends or receives external signals, which pass through the balun 301, to and from the balance filter 390 through the via hole 330.

The balun 301 contains the capacitor 350 and the inductor 370, and is evaporated on a certain area over the packaging substrate 310.

The insulator layer 360 passivates the balun 301 containing the capacitor 350 and the inductor 370. The insulator layer 360 is penetrated so that the electrodes 340 connected to the upper surface of the packing substrate 310 are connected to external terminals. The electrodes 340 are connected to the external terminals through a first terminal 341, 343, and 345 and a second terminal 342, 344, and 346. Here reference numerals 341 and 342 are referred to as extended electrodes.

Accordingly, externally supplied electric signals (for example, RF signals) are inputted through the first terminal 341, 343, and 345, and transferred to the internal balance filter 390 through the electrodes 340, the balun 301 containing the capacitor 350 and inductor 370, via holes 330, metal layer 320, and bonding layer 400.

The electric signals outputted from the balance filter 390 are transferred to the external terminals through the bonding layer 400, metal layer 320, via holes 330, electrodes 340, and second terminal 342, 344, and 346.

FIGS. 3A to 3M are vertical cross-sectional views for explaining a method of manufacturing the balance filter packaging chip 300 having the balun 301 mounted therein according to an exemplary embodiment of the present invention.

Figure 3A:
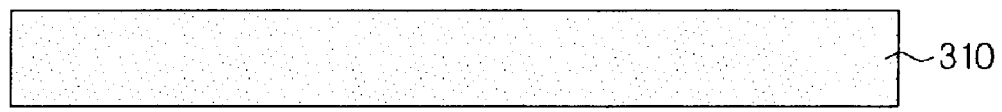
FIGS. 3A to 3M are vertical cross-sectional views for explaining a method of manufacturing the balance filter packaging chip having a balun mounted therein according to an exemplary embodiment of the present invention.
Figure 3B:
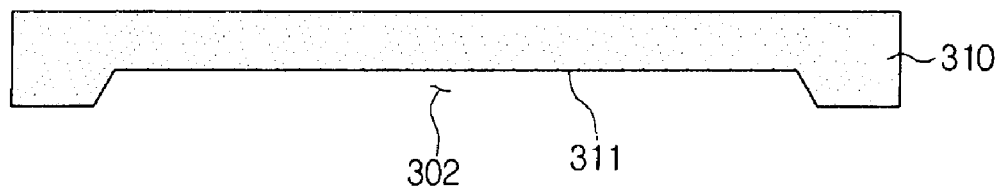
Figure 3C:
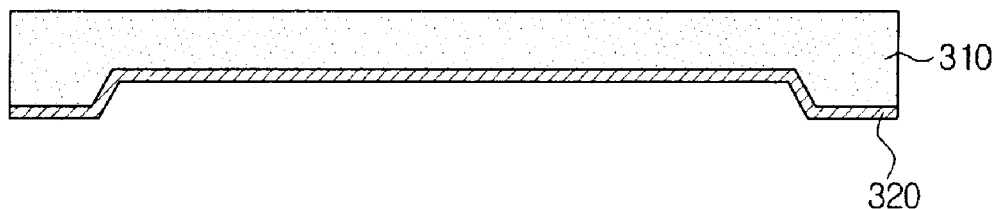

As shown in FIGS. 3A and 3B, a certain area on the lower surface 311 of the packaging substrate 310 is etched in order for the cavity 302 to be formed, but the etching may be omitted. Then, as shown in FIG. 3C, the metal layer 320 is evaporated on the whole bottom surface of the packaging substrate 310.

Figure 3D:
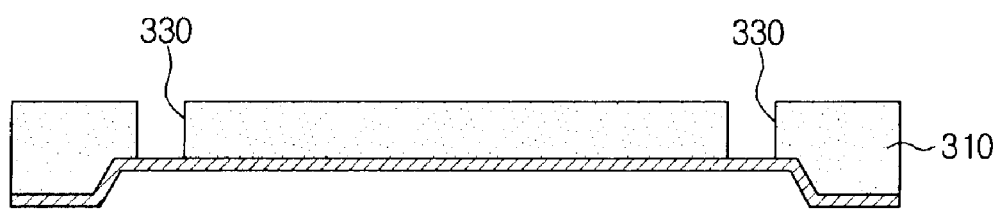

As shown in FIG. 3D, the packaging substrate 310 is patterned in order for the via holes 330 passing through the packaging substrate 310 to be formed, and then the via holes 330 are formed. Through the photoresist coating used in a semiconductor process, at least one or more via holes 330 are formed. The via holes 330 can be formed through a Reactive Ion Etching (RIE) process.

The via holes 330 pass through the packaging substrate 310, and exposes the metal layer 320 below the packaging substrate 310. In here, the number of the via holes 330 can be arbitrarily established according to the number of the terminals provided for the balance filter 390 which is packaged. On the other hand, it is preferable, but not necessary, in aspect of chip size reduction, for the via holes 330 to be formed to pass through to the inside of the cavity 302.

Figure 3E:
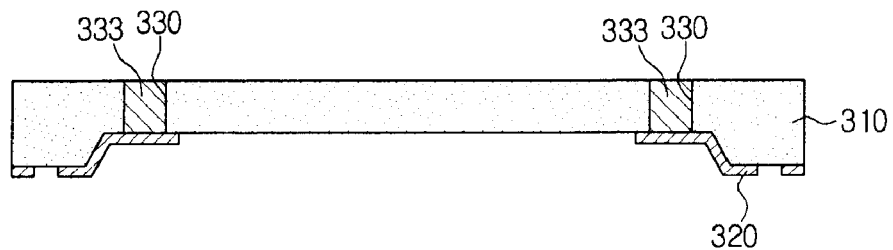

As shown in FIG. 3E, after the metal layer 320 is patterned in a certain form, the via holes 330 are filled with the conductive material 333 by using the metal layer 320 as a seed layer. The via holes are filled such that the via holes 330 are soaked into liquid metal, electricity is supplied to the metal layer 320, and coated.

Figure 3F:
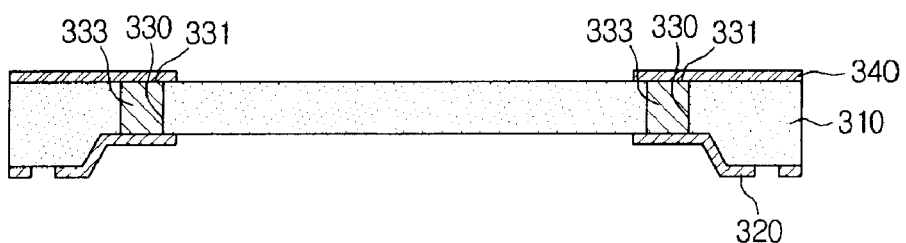

As shown in FIG. 3F, the electrodes 340 connected to the upper portion 331 of the via holes 330 are formed. The electrodes 340 are formed such that a metal material is evaporated on the upper surface of the packaging substrate 310 and then patterned.

Figure 3G:
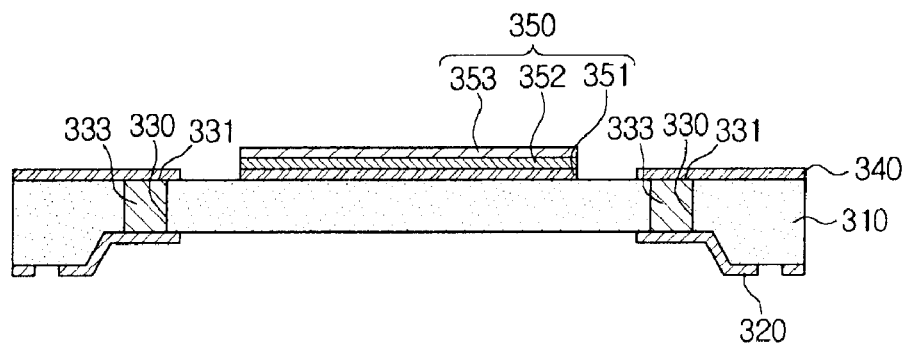

As well known, the balun 301 is formed with a capacitor and an inductor. As shown in FIG. 3G, the capacitor 350 is first evaporated on a certain location in order for the balun 301 is mounted on the upper surface of the packaging substrate 310. The capacitor 350 contains a lower electrode 351, a dielectric material 352, and an upper electrode 353.

Figure 3H:
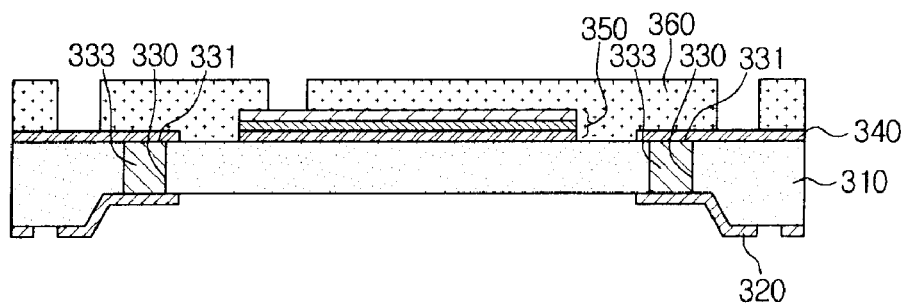
Figure 3I:
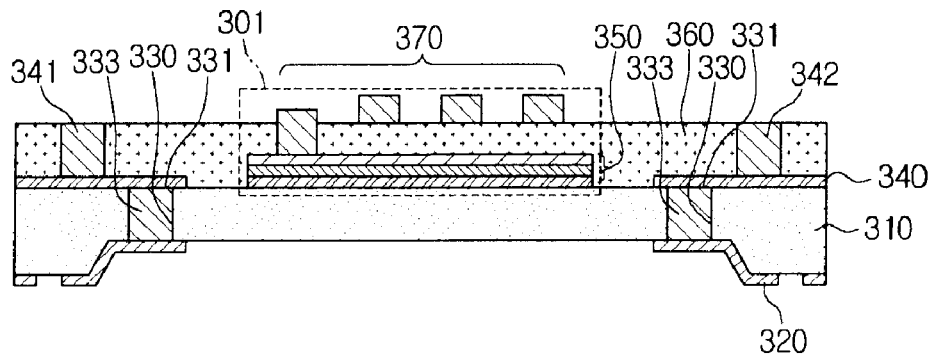

As shown in FIG. 3H, passivation is performed with the insulator 360, while certain portions of the electrodes 340 and capacitor 350 remain patterned. Polymer can be used as the insulator 360, and benzocyclobutene (BCB) can be used as the polymer. As shown in FIG. 3I, the unpassivated portions of the electrodes 340 and capacitor 350 are plated with metal in the same manner as the via holes 330 are filled in FIG. 3E. The inductor 370 is connected in the patterning manner to the portion connected to the capacitor 350. Accordingly, the electrodes 340 have the extended electrodes 341 and 342 to connect to external signals.

Figure 3J:
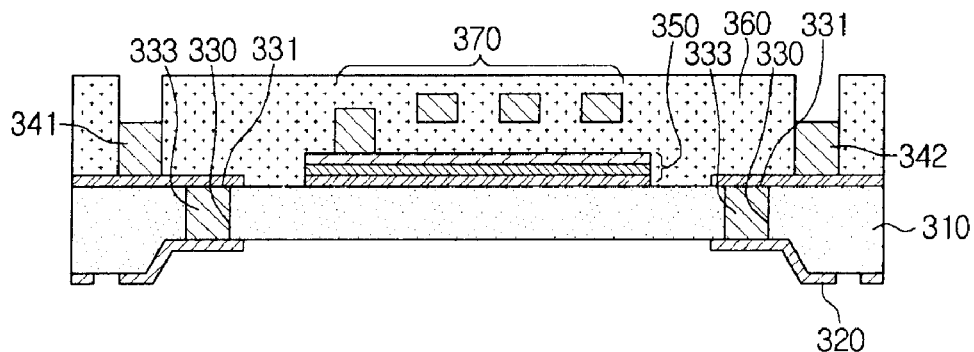

As shown in FIG. 3J, while a certain portions 341 and 342 of the electrodes 340 remain patterned, the passivation is performed once more with the insulator 360.

Figure 3K:
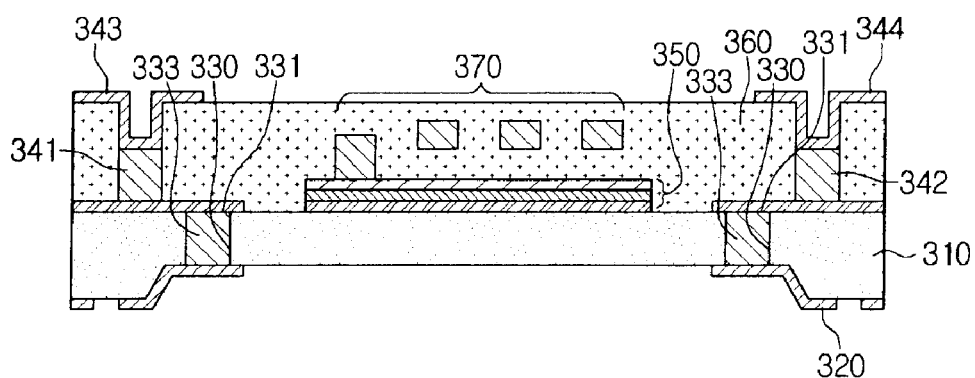

As shown in FIG. 3K, the extended electrodes 341 and 342 are generally formed of metal such as copper (Cu). The extended electrodes are plated with gold (Au) 343 and 344 for oxidation prevention.

Figure 3L:
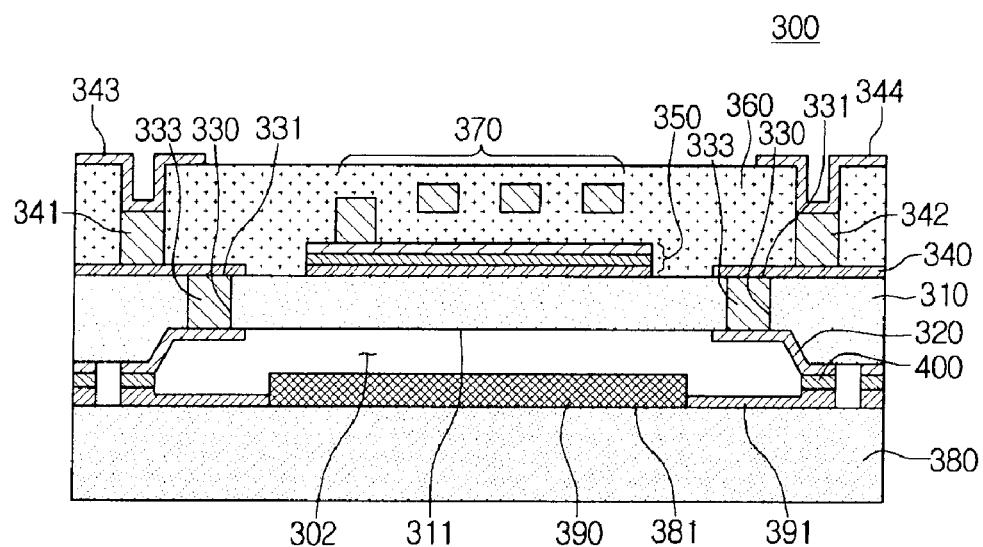

As shown in FIG. 3L, the packaging substrate 310 is combined with the device substrate 380. To do so, the balance filter 390 is mounted or evaporated on the upper surface of the device substrate 380. As described above, if the device substrate 380 is a PCB, the balance filter 390 can be embedded in the device substrate.

The bonding layer 400 is stacked between a certain portion of the metal layer 320 evaporated on the lower surface 311 of the packaging substrate 310 and the layer 391 formed on a certain portion of the upper surface of the device substrate 380, and then bonds the packaging substrate 310 with the device substrate 380. Here, the layer 391 electrically connects the bonding layer 400 and the balance filter 390.

Figure 3M:
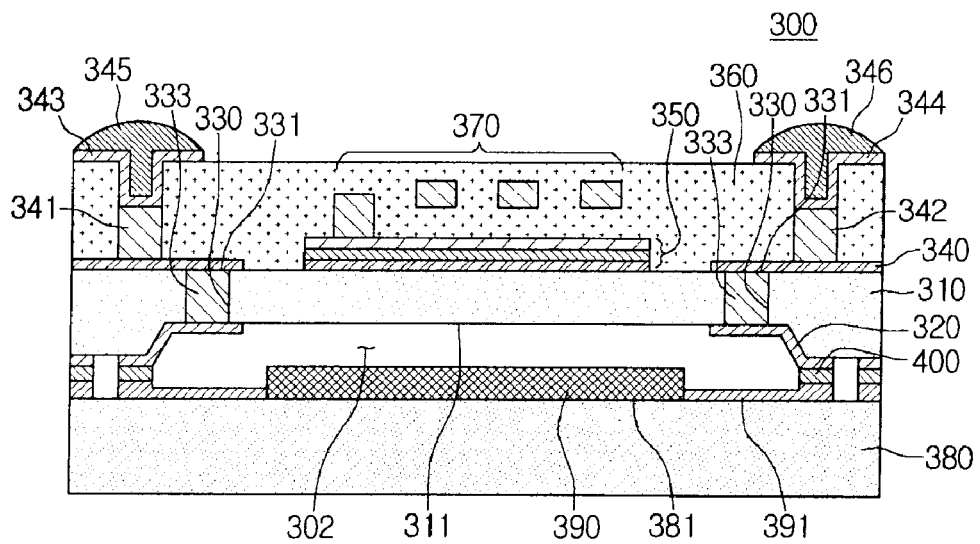

As shown in FIG. 3M, finally, a certain amount of lead (Pb) 345 and 346 is attached over the plated portions 343 and 344 of the extensions 341 and 342 of the electrodes 340, so the balance filter packaging chip 300 is manufactured and thus conveniently connected to external terminals.

The packaging chip as described above is manufactured in a wafer level. That is, two sheets of wafer that combine the packaging substrate 310 and the device substrate 380 are diced, and the balance filter packaging chip 300 having the balun 301 mounted therein is finally manufactured. Accordingly, the balance filter packaging chip 300 having the balun 301 mounted therein according to the process as described above is small in size, and can be manufactured through a process relatively simpler than conventional.

As aforementioned, the present invention can manufacture a balun on a packaging substrate, thereby reducing the element size and simplifying a process.

The foregoing exemplary embodiment and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. A method of manufacturing a balance filter packaging chip comprising:
   forming a packaging substrate;
   forming at least one balun over an upper surface of the packaging substrate; and
   bonding the packaging substrate with a device substrate with at least one balance filter mounted thereon.

2. The method as claimed in claim 1, wherein the forming of the packaging substrate comprises:
   forming a cavity by etching at least one certain area of a lower surface of the packaging substrate;
   evaporating a metal layer on the whole lower surface of the packaging substrate;
   forming at least one via hole by patterning the packaging substrate;
   filling the at least one via hole with a conductive material by using the metal layer as a seed layer after patterning the metal layer in a certain form; and
   evaporating at least one electrode connected to each upper portion of the at least one via hole.

3. The method as claimed in claim 2, wherein the forming of the at least one balun comprises operations of:
   (a) evaporating at least one capacitor on at least one certain position of the upper surface of the packaging substrate;
   (b) passivating the at least one capacitor with an insulator while at least one certain portion of the at least one electrode and at least one certain portion of the at least one capacitor remain patterned;
   (c) plating at least one certain unpassivated portion of the at least one electrode and the at least one capacitor with metal;
   (d) connecting at least one inductor in a patterning manner to the at least one certain portion of the at least one capacitor plated with metal; and
   (e) passivating the at least one inductor with the insulator while the at least one certain portion of the at least one electrode remains patterned.

4. The method as claimed in claim 3, wherein, in operation (b), the passivation is performed with polymer.

5. The method as claimed in claim 3, further comprising an operation of plating the at least one certain portion of the at least one electrode with gold (Au) after operation (e) is performed.

6. The method as claimed in claim 1, wherein, the bonding of the packaging substrate with the device substrate comprises stacking at least one bonding layer between at least one certain portion of at least one metal layer evaporated on a lower surface of the packaging substrate and at least one certain portion of an upper surface of the device substrate, and bonding the packaging substrate with the device substrate.

7. The method as claimed in claim 5, further comprising attaching a certain amount of lead (Pb) over the plated gold (Au).

8. The method as claimed in claim 1, further comprising dicing the bonded packaging substrate and device substrate.

9. The method as claimed in claim 4, wherein the polymer comprises benzocyclobutene (BCB).

* * * * *